US012672582B2

(12) United States Patent
Lee et al.

(10) Patent No.: US 12,672,582 B2
(45) Date of Patent: Jun. 30, 2026

(54) STRETCHABLE ELECTRONIC DEVICE AND METHOD FOR FABRICATING THE SAME

(71) Applicant: GWANGJU INSTITUTE OF SCIENCE AND TECHNOLOGY, Gwangju (KR)

(72) Inventors: Jongho Lee, Gwangju (KR); Namyun Kim, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 770 days.

(21) Appl. No.: 17/865,163

(22) Filed: Jul. 14, 2022

(65) Prior Publication Data

US 2023/0019182 A1 Jan. 19, 2023

(30) Foreign Application Priority Data

Jul. 15, 2021 (KR) ........................ 10-2021-0092667

(51) Int. Cl.
| | |
|---|---|
| *H10W 90/00* | (2026.01) |
| *H10H 20/01* | (2025.01) |
| *H10H 20/831* | (2025.01) |
| *H10H 20/857* | (2025.01) |

(52) U.S. Cl.
CPC ............ *H10W 90/00* (2026.01); *H10H 20/01* (2025.01); *H10H 20/8312* (2025.01); *H10H 20/857* (2025.01); *H10H 20/0364* (2025.01)

(58) Field of Classification Search
CPC . H01L 25/0753; G09F 9/301; H10H 20/0364; H10H 29/142; H10H 20/8312; H10W 90/00
See application file for complete search history.

(56) References Cited

U.S. PATENT DOCUMENTS

| | | | |
|---|---|---|---|
| 2014/0144480 A1 | 5/2014 | Lee | |
| 2016/0295689 A1* | 10/2016 | Chang | .................. H05K 1/0283 |
| 2020/0161287 A1* | 5/2020 | Yoo | .......................... G09F 9/301 |
| 2020/0212117 A1* | 7/2020 | Jeon | ........................ H10K 71/00 |
| 2021/0027673 A1* | 1/2021 | Kim | ......................... G09F 9/301 |
| 2021/0166590 A1 | 6/2021 | Jung et al. | |
| 2022/0085130 A1* | 3/2022 | Zhai | ...................... H10K 59/131 |

FOREIGN PATENT DOCUMENTS

| | | |
|---|---|---|
| KR | 101404472 B1 | 6/2014 |
| KR | 20200128994 A | 11/2020 |
| KR | 1020210068737 A | 6/2021 |

OTHER PUBLICATIONS

Kim. "Stretchable Electronics for Reusable Multichannel Skin Patch and High Fill Factor Display." Dissertation, School of Mechanical Engineering, Gwangju Institute of Science and Technology (2021).
KR Serial No. 10-2021-0092667. Examination Report (Dec. 28, 2022).

* cited by examiner

*Primary Examiner* — Monica D Harrison
*Assistant Examiner* — Jacob T Nelson
(74) *Attorney, Agent, or Firm* — Heidi Eisenhut; LOZA & LOZA, LLP

(57) ABSTRACT

A stretchable electronic device includes an array including at least two islands spaced apart from each other to dispose a device, and an interconnector to perform a stretchable action between the islands, and an external connection to apply an electrical signal to the array.

9 Claims, 14 Drawing Sheets

0%

10% in x-dir.

10% in y-dir.

10% in x- and y-dir.

(i) Single layer design (small fill factor)

(ii) Double-layer modular design (large fill factor)

(iii) Double-layer modular design (larger fill factor)

(iv) Stretching

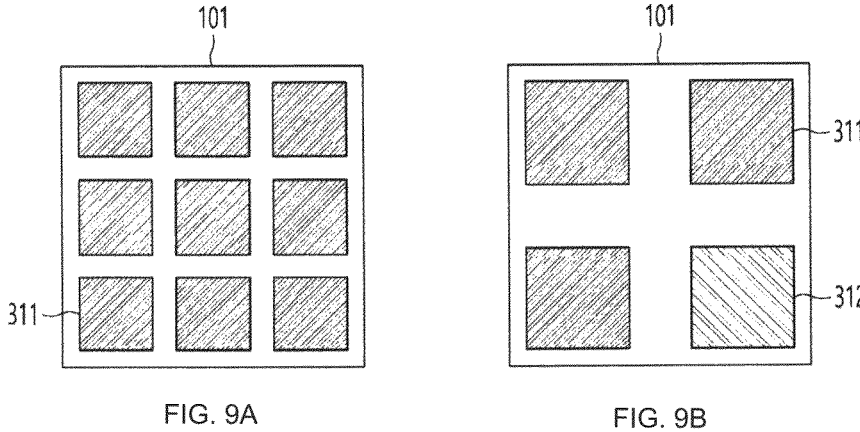
FIG. 9A                    FIG. 9B
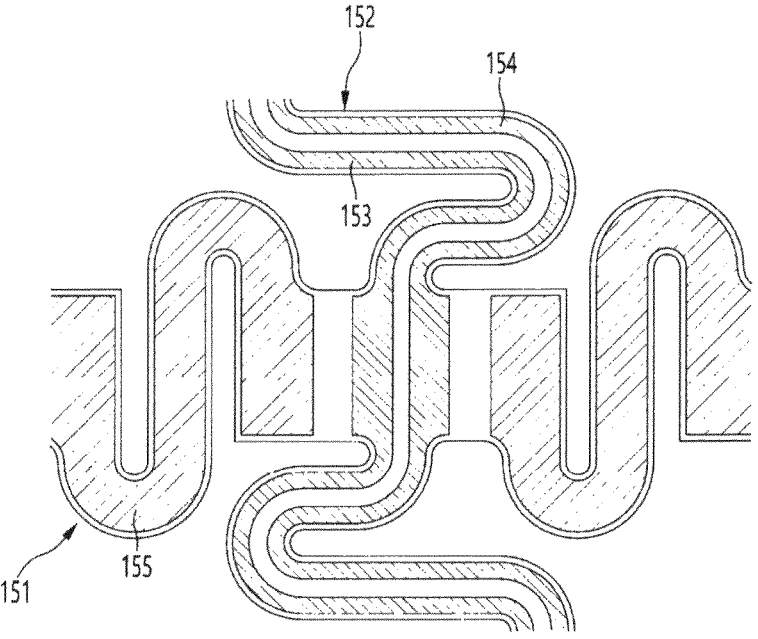
FIG. 10

231   232   233   234

1

STRETCHABLE ELECTRONIC DEVICE AND METHOD FOR FABRICATING THE SAME

CROSS-REFERENCE TO RELATED APPLICATIONS

This application is based on and claims priority under 35 U.S.C. § 119 and 35 U.S.C. § 365 to Korean Patent Application No. 10-2021-0092667, filed on Jul. 15, 2021, in the Korean Intellectual Property Office, the disclosure of which is incorporated by reference herein its entirety.

BACKGROUND

The present disclosure relates to a stretchable electronic device and a method for preparing the same.

In modern life, various electronic devices have enriched life.

Among them, the display device is a device which transmits information visually. The display device has been advanced, so a flexible display device has been commercialized.

As a new form of the display device, a stretchable display device has been spotlighted. The stretchable display device is expected to be grafted to various technologies such as wearables. In addition, various electronic devices, such as solar cells and communication devices, may have stretchable characteristics.

The applicant of the present disclosure filed Korean application no. 10-2020-0128994 which is entitled "a micro-light emitting device array making contact with skin, a method for fabricating the array, and a charging system of an electronic device, which is inserted into a living body" belonging to a technology of transferring a micro-light emitting device to a substrate. Through the technology, it was recognized that the light emitting device is transferred to the substrate to be used as a light emitting device array.

Accordingly, the applicant has come to provide a stretchable electronic device for the light emitting device while focusing on the technology development.

SUMMARY

The present disclosure is to provide a stretchable electronic device and a method for stretching the same.

According to the present disclosure, a stretchable electronic device may include an array including at least two islands spaced apart from each other to dispose a device and an interconnector to perform a stretchable action between the islands, and an external connection to apply an electrical signal to the array.

The array may include an interconnecting layer to provide the interconnector and to supply the electrical signal, which is applied from the external connection, to the at least two islands through the interconnector, a circuit layer disposed on the interconnecting layer, and a device layer disposed on the circuit layer for dispose the device.

A plurality of devices may be disposed in at least one island of the at least two islands.

The interconnector may have no circuit layer and device layer.

The number of devices disposed in the at least one island of the at least two islands may be $n^2$.

The interconnecting layer may include a first insulating layer positioned at a lower portion of the interconnecting layer, a first conductive layer on the first insulating layer, a second insulating layer on the first conductive layer, and a first bonding layer provided, as a plurality of spacing parts on the second insulating layer are open, and connected to the circuit layer.

Three or four first bonding layers are provided in each island.

The circuit layer may include a second bonding layer connected to the interconnecting layer, a second conductive layer on the second bonding layer, and a third insulating layer on the second conductive layer.

An empty space may be provided in a bottom surface of the second conductive layer.

The device layer may include a device disposed on the third insulating layer, first and second electrodes connected to the device and the second conductive layer to input or output an electrical signal, and a protective layer to protect the device and an electrode.

The interconnector has a shape of a plane including a serpentine portion and having a thin thickness.

The at least one island of the at least two islands may include a first interconnector extending in a left-right direction, and a second interconnector extending in an up-down direction.

Three independent conductive lines may be provided through the first and second interconnectors.

The plurality of devices disposed in the at least one island of the at least two islands may include a first device and a second device which have different types.

The number of first devices may be greater than the number of second devices.

The second device may include a transistor.

According to the present disclosure, a method for fabricating a stretchable electronic device may include processing a device, providing a first conductive layer and an insulating layer on a substrate having a sacrificial layer, and providing a first bonding layer, as a spacing part of the insulating layer is exposed, to provide an interface layer, providing a second conductive layer and a second bonding layer on the substrate having the sacrificial layer to provide a circuit layer, providing an island by bonding the first bonding layer to the second bonding layer, performing a printing process by transferring the device to an exposed surface of the circuit layer and, and connecting the device to the second conductive layer.

The device includes devices simultaneously manufactured, on a single wafer, in the same number as the number of devices to be transferred to one island, the number of devices to be transferred to a single array, or the number of devices to be transferred together to at least two islands.

The first conductive layer and the second conductive layer may be differently patterned.

According to the present disclosure, a stretchable electronic device having a higher fill factor of an electronic device may be obtained.

According to the present disclosure, the stretchable electronic device having the higher brightness and the higher integration degree may be obtained.

BRIEF DESCRIPTION OF THE DRAWINGS

FIG. 9A is a view illustrating that a single type of first device is disposed in a device layer.

FIG. 9B is a view illustrating that a first device and a second device in different types are disposed in a device layer.

FIG. 10 is a plan view of an interconnection layer of the active stretchable electronic device.

FIGS. 13, 14, and 15 are views illustrating a method of manufacturing a stretchable electronic device according to an embodiment, in which FIG. 13 is a method of manufacturing a device, FIG. 14 is a method of manufacturing a circuit layer and an interconnection layer, and FIG. 15 is a view illustrating a final assembly process.

DETAILED DESCRIPTION OF THE EMBODIMENTS

Figures 1A, 1B, 1C, 1D, 1E:
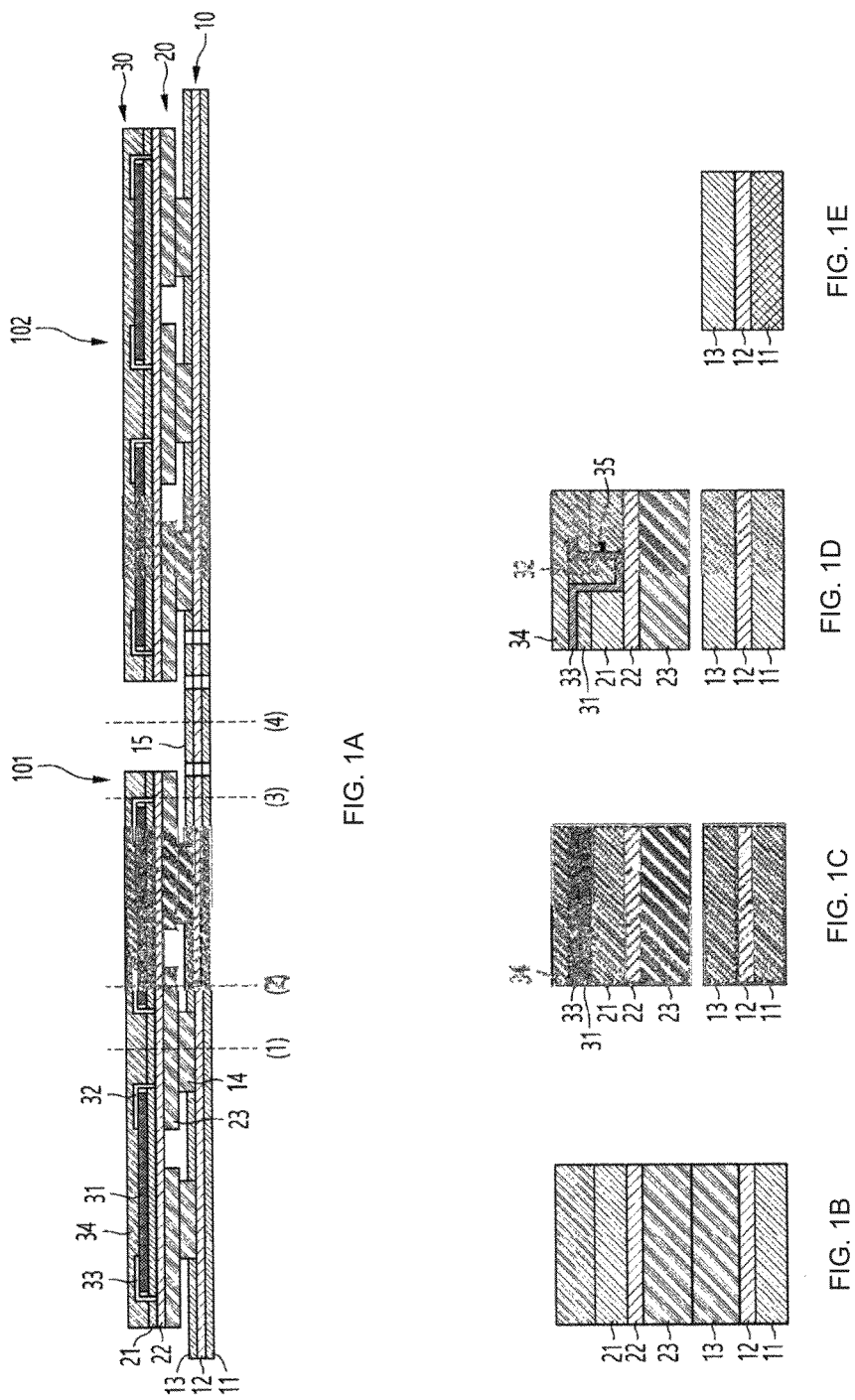
FIGS. 1A, 1B, 1C, 1D, and 1E are cross-sectional views illustrating a portion of a stretchable electronic device according to an embodiment.

Hereinafter, the detailed embodiment of the present disclosure will be described with reference to accompanying drawings. However, the spirit of the present disclosure is not limited to suggested embodiments, and those skilled in the art, which understand the spirit of the present disclosure, may easily suggest another embodiment by adding, changing, or deleting a component within the same technical scope.

In the following description made with accompanying drawings, the same reference numerals will be assigned to the same component or like components, and the duplication thereof will be omitted to avoid redundancy.

In addition, the following description of the present disclosure, a detailed description of well-known art or functions will be ruled out in order not to unnecessarily obscure the gist of the present disclosure.

The accompanying drawings are provided to allow those skilled in the art to easily understand an embodiment of the present disclosure, and the technical spirit of the present disclosure is not limited thereto accompanying drawings. The present disclosure is to cover all modifications, equivalents, and alternatives falling within the spirit and scope of the present disclosure.

Although the terms including ordinal numbers, such as "first" and "second" may be used to describe various components, the components are not limited to the terms. The terms are used only to differentiate one component from another component.

It will be understood that when a component is referred to as being coupled with/to" or "connected to" another component, the component may be directly coupled with/to or connected to the another component or an intervening component may be present therebetween. In contrast, when an element is referred to as being "directly connected" or "directly coupled" to another element, there are no intervening elements.

The terms of a singular form may include plural forms unless otherwise specified.

In the disclosure, It will be further understood that the terms "comprises," "comprising," "includes," or "including," or "having" specify the presence of stated features, numbers, steps, operations, components, parts, or the combination thereof, but do not preclude the presence or addition of one or more other features, numbers, steps, operations, components, parts, and/or the combination thereof.

Figure 2:
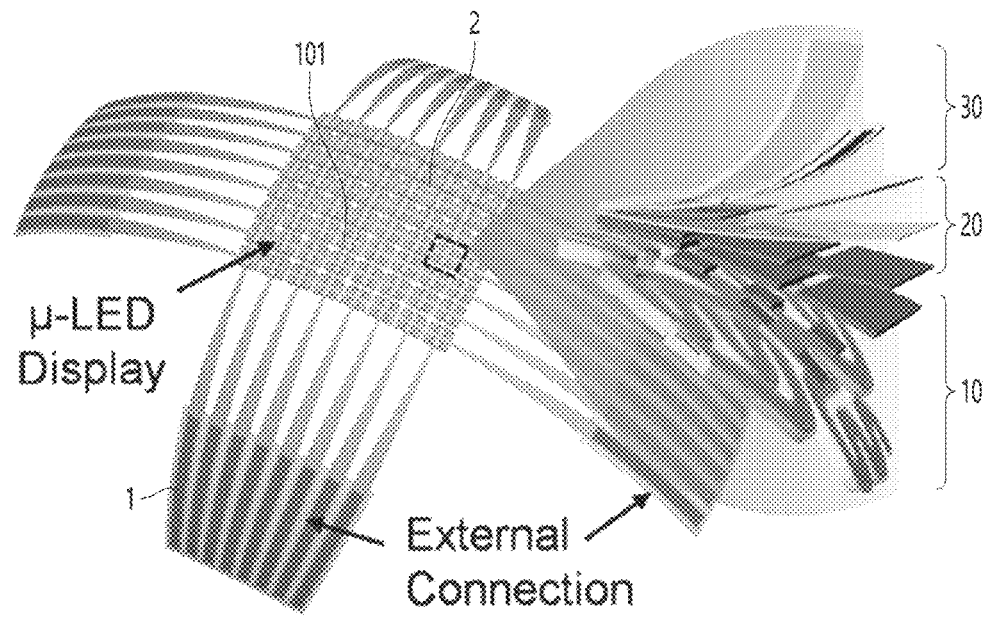
FIG. 2 is a perspective view of a stretchable electronic device according to an embodiment.

FIGS. 1A, 1B, 1C, and 1D are cross-sectional views illustrating a portion of a stretchable electronic device according to an embodiment, and FIG. 2 is a perspective view of the stretchable electronic device according to an embodiment.

Referring to FIGS. 1A, 1B, 1C, and 1D and 2, the stretchable electronic device includes an array 2 in which an element is disposed, and an external connection 1 to apply an electrical signal to the array 2. A plurality of islands may be disposed in the array 2. The islands may be connected to each other up, down, left, and right through an interconnector 15. The interconnector 15 may have a stretchable characteristic. The stretchable characteristic may include a characteristic in which the interconnector 15 may be restored to an original shape after being stretched by external force. In FIGS. 1A, 1B, 1C, and 1D, two islands 101 and 102 are illustrated. At least one device 31 may be disposed in the island. The device may be provided as a light emitting diode by way of example. Four devices may be disposed in the island. In the island, n^2 (where n is a natural number) devices may be disposed at equal distances.

The configuration of the array will be described in more detail with reference to FIGS. 1A, 1B, 1C, and 1D.

FIG. 1A is a cross-sectional view illustrating two islands cut up and down, and FIGS. 1B to 1E are cross-sectional view take along line (1), (2), (3), (4), of FIG. 1A, respectively.

Referring to FIGS. 1A, 1B, 1C, and 1D, the array 2 may include an interconnecting layer 10 disposed on a lower portion thereof to perform a stretchable action, a circuit layer 20 disposed on the interconnector layer 10 to supply an electrical signal to each island, and a device layer 30 disposed on the circuit layer. The island may have the interconnecting layer 10, the circuit layer 20, and the device layer 30. The interconnecting layer may be provided between two adjacent islands.

The interconnecting layer 10 may be connected to the external connection 1 to apply power. The interconnecting layer 10 may include a first insulating layer 11, which is positioned at a lower portion of the interconnecting layer 10, a first conductive layer 12 on the first insulating layer 11, and a second insulating layer 13 on the first conductive layer 12. A plurality of spacing parts of the second insulating layer 13 may be open and the first bonding layer 14 is provided in the spacing parts. The first and second insulating layers 11 and 13 may include polyimide PI, and the first conductive layer 12 may include copper (Cu). In the following description, unless otherwise specified, the insulating layer include polyimide, and the conductive layer may include copper (Cu).

According to the above configuration, the first conductive layer 12 may be electrically connected to the first bonding layer 14 to supply power. The first conductive layer 12 and the first bonding layer 14 may be directly connected to each other. The bonding layer 14 may include lead (Pb) as a main material. In addition, the bonding layer may include other electrical connection materials. Although the bonding layer may include lead (Pb) unless otherwise specified, in the following description, the bonding layer may include other materials.

The first conductive layer 12 may be patterned in a specific shape between the first and second insulating layers 11 and 13. For example, referring to FIGS. 1A, 1B, 1C, and 1D, three first bonding layers 14 may be provided in one island 101. In this case, the first conductive layer 12 may be connected to the bonding layers, but the bonding layers may be connected to different conductive lines of the first conductive layer. In this case, the conductive lines may be independent from each other, and open to each other. Accordingly, the device layer may be prevented from being shorted.

An interconnector 15 may be provided on the interconnecting layer 10 to connect the islands 101 and 102 to each other. The circuit layer 20 and the device layer 30 may not be provided with respect to the interconnector 15. The interconnector 15 may include a serpentine portion to have stretchable characteristics. A planar shape of the interconnector may be illustrated in FIG. 3. The interconnector 15 may be provided as a substantially two-dimensional plane having a thin thickness. The interconnector 15 may include portions in which both the first and second insulating layers 11 and 13 and the first conductive layer 12 are serpentine. The stretchable characteristic of the interconnector 15 may be implemented by deforming the serpentine shapes of the first and second insulating layers 11 and 13 including polyimide, and the first conductive layer 12 including copper.

The circuit layer 20 may include a second bonding layer 23 connected to the first bonding layer 14, a second conductive layer 22 on the second bonding layer 23, and a third insulating layer 21 on the second conductive layer 22. The second conductive layer 22 may be patterned to prevent an electrical short, which is similar to the first conductive layer 12.

An insulating layer may not be provided on a bottom surface of the second conductive layer 22. A space between the second conductive layer 22 and the second insulating layer 13 may be empty in a place in which the bonding layer 23 is not provided. Referring to FIGS. 1C and 1D, a space between the second insulating layer 13 and the second bonding layer 23 may be empty. Inert gas or air may be contained in the empty space.

The device layer 30 may include a device 31 disposed on the third insulating layer 21, first and second electrodes 32 and 33 connected to the device 31 to input and output an electrical signal, and a protective layer 34 to protect the device 31 and the electrodes. A via hole 35 may be machined in the third insulating layer 21 such that the first and second electrodes 32 and 33 may pass through the via hole 35. The electrode may be connected to the third insulating layer 21 through the via hole 35.

The device may include a light emitting device, an organic light emitting device, a photovoltaic device, a transistor device, a micro-light emitting device, and other electronic devices. According to an embodiment, the device may be the light emitting device by way of example.

The island may be defined as an upper portion of a boundary between the bonding layers 14 and 23, in a narrow sense. The island may be interpreted as including the bonding layer in a broad sense.

In the island, a plurality of devices 31 may be disposed together on any one island. The electrodes and the second conductive layer 22 may be formed by patterning, such that an electrical signal which has passed through a device of the plurality of devices 31 reaches another device. At least some of the plurality of devices may be connected in series to each other. At least others of the plurality of devices may be connected in parallel to each other. The series or parallel connection of the plurality of devices may be controlled by differently patterning the first conductive layer 12 and the second conductive layer 22. For example, the first and second conductive layers 12 and 22 may be patterned, such that the devices arranged in a row to the left and right may be controlled together by a single electric signal, but devices arranged in a vertical direction may be controlled by different electric signals.

Figure 3:
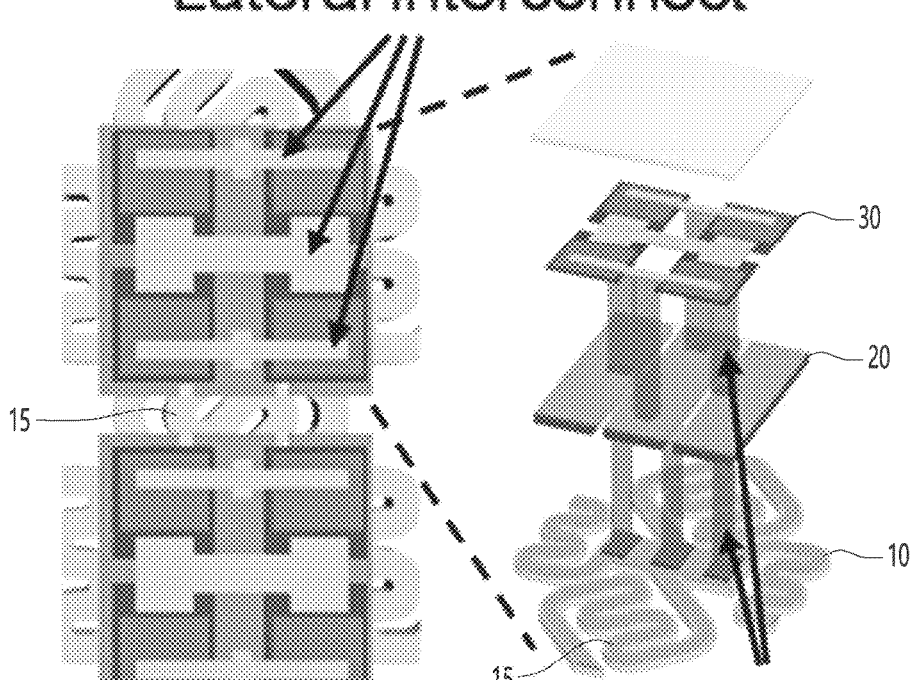
FIG. 3 is a view illustrating a configuration of an interconnector in more detail.

FIG. 3 is a view illustrating a configuration of the interconnector in more detail.

Referring to FIG. 3, each of the islands 101 and 102 may be connected by an interconnector 15 up, down, left, and right. The interconnector 15 may be patterned in a serpentine shape to obtain stretchable characteristics. Power may be input from the right side, pass through all devices, and then output to the right side.

In the array 2, the interconnector 15 has a stretchable characteristic. In the array 2, the lower interconnecting layer 10 corresponding to the island has no stretchable characteristics. According to the configuration, the overall stretchable characteristics of the array 2 may be smoothly implemented. Since the device layer 30 and the circuit layer 20 are not deformed, an electrical operation of an island and physical mounting characteristics of the device are normal.

The array 2 may have a two-layered structure in which the interconnecting layer 10 and the device layer 30 are completely separate from each other. The interconnecting layer 10 and the device layer 30 are separate from each other and connected to each other through the circuit layer 20. Accordingly, any influence of the stretchable action may not be substantially exerted on the device layer 30.

Each of the islands 101 and 102 provided in the array 2 may operate in the form of a single electronic module. A plurality of electronic devices may be disposed in the electronic module. Accordingly, the fill factor of the device may be increased. Since the stretchable action does not reach each island, a plurality of electronic devices may be seated in a single island.

FIGS. 4A, 4B, 4C, 5A, 5B, 6A, 6B, 6C, 6C, and 6D are views illustrating stretchable characteristics of stretchable electronic devices, and device characteristics based on the stretchable characteristic.

Figures 4A, 4B, 4C:
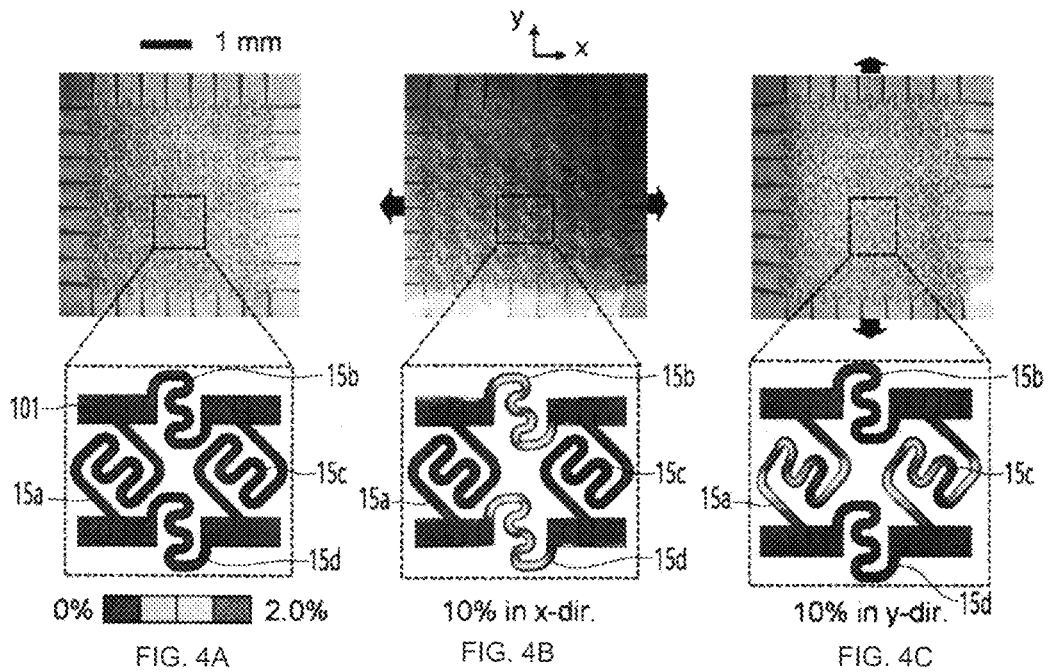
FIGS. 4A, 4B, 4C, 5A, 5B, 6A, 6B, 6C, 6C, and 6D are views illustrating a stretchable characteristic of a stretchable electronic device and a device characteristic based on the stretchable characteristic.

FIG. 4A illustrates an actual product and the result of the finite element analysis before deformation, FIG. 4B illustrates an actual product and the result of the finite element analysis after the actual product is stretched by 10% in a left and right direction, and FIG. 4C illustrates an actual product and the result of the finite element analysis after the actual product is stretched by 10% in an up and down direction. Referring to each drawing, it may be recognized that the interconnector sufficiently absorbs the deformation. Accordingly, the interconnector may sufficiently absorb deformation without exerting any influence on the device layer and the circuit layer.

Figures 5A, 5B:
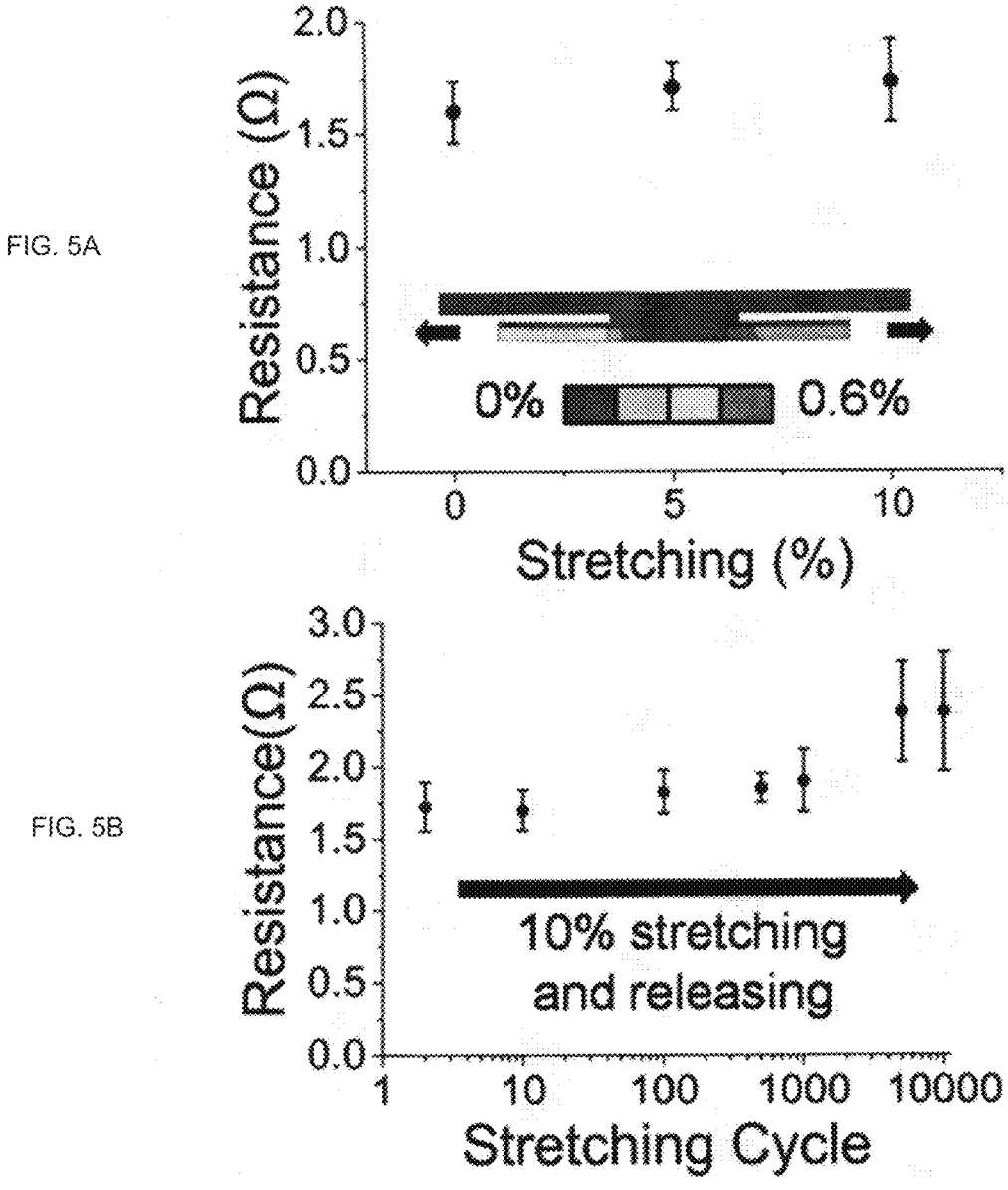

FIG. 5A is a graph illustrating the measurement result of an actual change in resistance when being extended by 10% in a y direction, and FIG. 5B is a graph illustrating the measurement result of a change in resistance, when stretching and contracting by 10% are repeated 10,000 times in the y direction. Referring to each drawing, it may be recognized that the conductive layer of the interconnector may be used in spite of the changes during the stretching operation. In addition, it may be recognized that the interconnector may stably operate, in spite of repeated deformation.

Figures 6A, 6B, 6C, 6D:
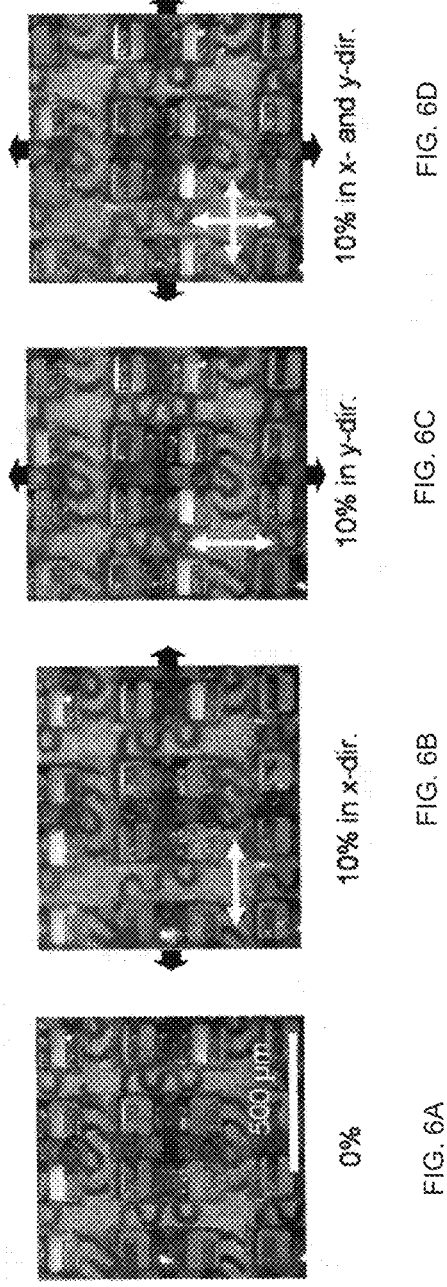

FIG. 6A illustrates a photograph of a product which is not stretched, FIG. 6B illustrates a photograph of a product which is stretched by 10% in an x direction, FIG. 6C illustrates a photograph of a product which is stretched by 10% in the y direction, and FIG. 6D illustrates a photograph of an actual product which is stretched by 1-% in the x direction and the y direction. Referring to the drawings, it may be recognized that the stretchable characteristic is smoothly implemented.

FIGS. 7A, 7B, 7C, 7D, and 8 are views illustrating effects of the present disclosure in terms of a fill factor.

Figures 7A, 7B, 7C, 7D:
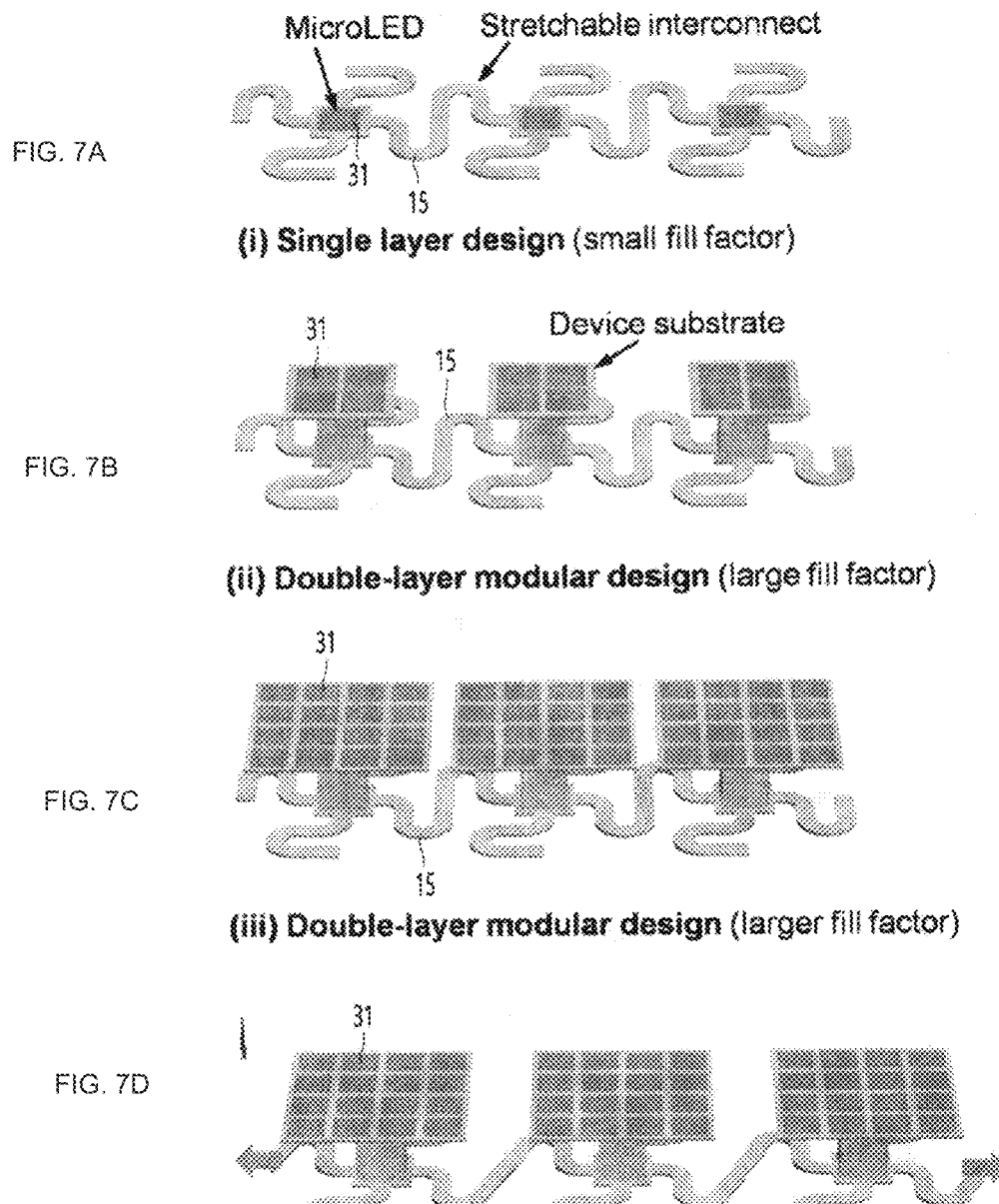
FIGS. 7A, 7B, 7C, 7D, and 8 are views illustrating the effects of the present disclosure in terms of a fill factor.

FIG. 7A is a view illustrating a single layer structure in which a device is directly seated on an interconnecting layer, according to a comparative example, FIGS. 7B and 7C are views illustrating double-layer structures in which a circuit layer is involved in the interconnecting layer, so a device layer is independent from an interconnect layer. Among them, FIG. 7B illustrates that four devices are disposed in a single island, and FIG. 7C illustrates that nine devices are disposed in a single island.

When comparing the drawings, it may be recognized that more many devices may be mounted on the same two-dimensional area, when the double layer is formed.

FIG. 7D is a view illustrating that the interconnector 15 of FIG. 7C is stretched. When comparing between FIG. 7C and FIG. 7D, the stretchable device having the double-layer structure according to an embodiment may be implemented with the higher fill factor. Accordingly, even if the electronic device is stretched, the original function of the electronic device may be less damaged. For example, according to an embodiment, when the stretchable electronic device is applied to a stretchable display device, even if the display device is stretched, the brightness is less lowered. Accordingly, the stable operation of the device may be maintained.

Figure 8:
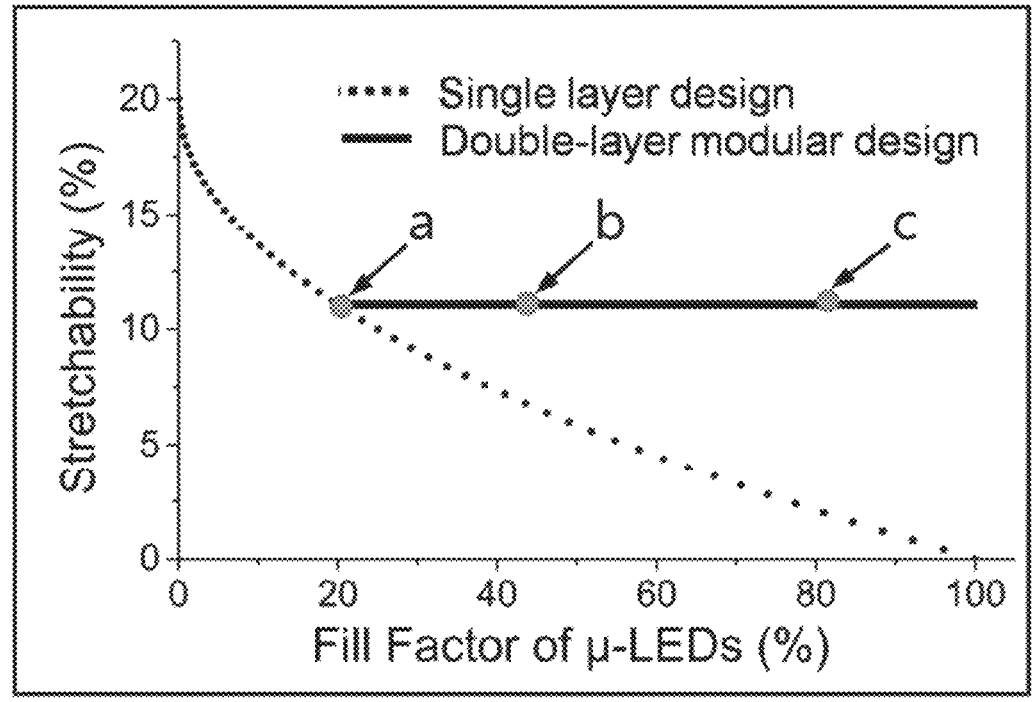

FIG. 8 is a graph illustrating the comparison between a single layer design and a double layer modular design in terms of a fill factor.

Referring to FIG. 8 to obtain the same stretchable characteristics, the same interconnector is used by way of an example. In this case, in the case of FIG. 7A, approximately 20% of the fill factor may be obtained. In the case of FIG. 7B, about 45% of a fill factor may be obtained. In the case of FIG. 7C, about 80% of a fill factor may be obtained.

To obtain, in the single layer design, the same fill factor performance as that of the double-layer modular design, it may be recognized that the stretchable characteristics is rapidly decreased.

Although the above embodiment is to illustrate that the same device is disposed in the device layer 30, different types of deices may be disposed in the device layer 30 according to an embodiment of the present disclosure. FIGS. 9A and 9B are views illustrating the cases.

FIG. 9A is a view illustrating that a single type of first device 311 is disposed in the device layer 30. FIG. 9B is a view illustrating which a first device 311 and a second device 312 in different types are disposed in the device layer 30. The first device 311 may be a micro-light emitting device. The second device 312 may be a transistor. The second device 312 may control the first device 311.

A single type of first device may be disposed on an island, which is referred to as a manual stretchable electronic device. When a first device and a second device controlling the first device may be disposed in different types, which is referred to as an active stretchable electronic device.

FIG. 10 is a plan view of an interconnection layer of the active stretchable electronic device.

Referring to FIG. 10, three conductive lines may be provided to the active stretchable electronic device. Specifically, a common line 155 may be provided in a first interconnector 151 extending in a left-right direction, and a gate line 154 and a data line 153 may be provided in a second interconnector 152 extending in an up-down direction. In addition, the line in the first interconnector 151 may be exchanged with the lines in the second interconnectors 152. In any case, three lines may be provided in the first and second interconnectors 151 and 152.

Figure 11A:
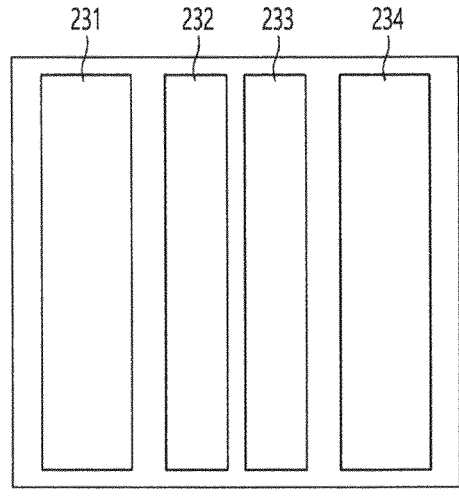
FIG. 11A is a bottom view illustrating a circuit layer of an active stretchable electronic device.
Figure 11B:
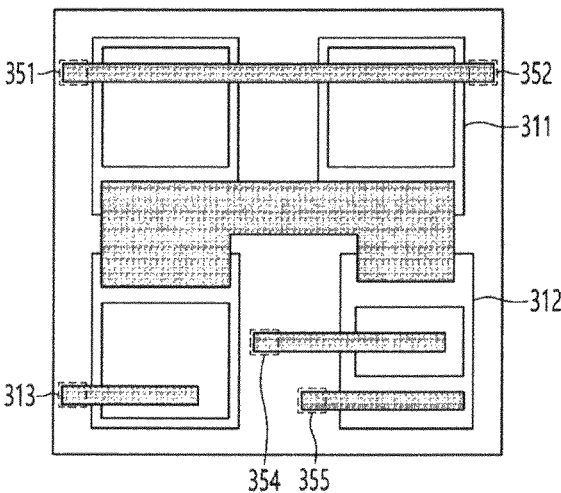
FIG. 11B is a plan view of a circuit layer of an active stretchable electronic device.

FIG. 11A is a bottom view illustrating the circuit layer of the active stretchable electronic device, and FIG. 11B is a plan view of the circuit layer of the active stretchable electronic device.

Referring to FIGS. 10, 11A, and 11B, first and second common electrodes 231 and 234 may be connected to ends of a pair of common lines 155 facing each other. A data electrode 233 may be connected to the data line 153. The gate electrode 232 may be connected to a gate line 154.

The data electrode 233 and the gate electrode 232 may apply a signal to the second device 312 through fourth and fifth via holes 354 and 355, respectively. The second device 312 may be controlled in response to a data signal and a gate signal.

The first and second common electrodes 231 and 234 may be connected to a relevant one of first devices 311 through the first, second, and third via holes 351, 352 and 353. The second device 312 and the first device 311 may be connected to each other such that an on/off state of the first device 311 is controlled. In this case, the number of first devices is greater than the number of second devices. Accordingly, a plurality of first devices may be controlled together by a single second device. In this case, when the first device is a light emitting device, the brightness may be more increased, and a fill factor may be more increased.

As described above, each island of the active stretchable electronic device, that is, the electronic module, may be independently controlled in an on/off state and the operating characteristic thereof.

Figure 12:
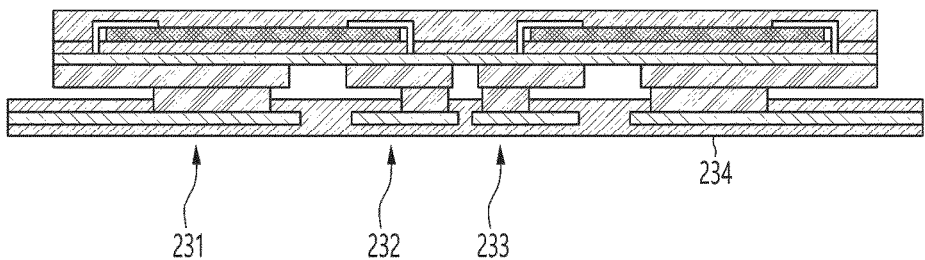
FIG. 12 is a partial cross-sectional view of an active stretchable electronic device.

FIG. 12 is a partial cross-sectional view of an active stretchable electronic device. FIG. 12 is a view corresponding to FIG. 1 corresponding to a cross-sectional view of the manual stretchable electronic device. The description of FIGS. 1A, 1B, 1C, and 1D will be applied to the description of FIG. 12 except for those of the patterns of a conductive layer and an electrode. Accordingly, the description of the same component will follow the description of FIG. 1.

Referring to FIG. 12, four electrodes 231, 232, 233 and 234 as bonding layers may be provided at an interface between the circuit layer 20 and the interconnecting layer 10. Two of the bonding layers may be connected to two common lines 155, one may be connected to a gate line 154, and a remaining one may be connected to a data line 153.

Figure 13:
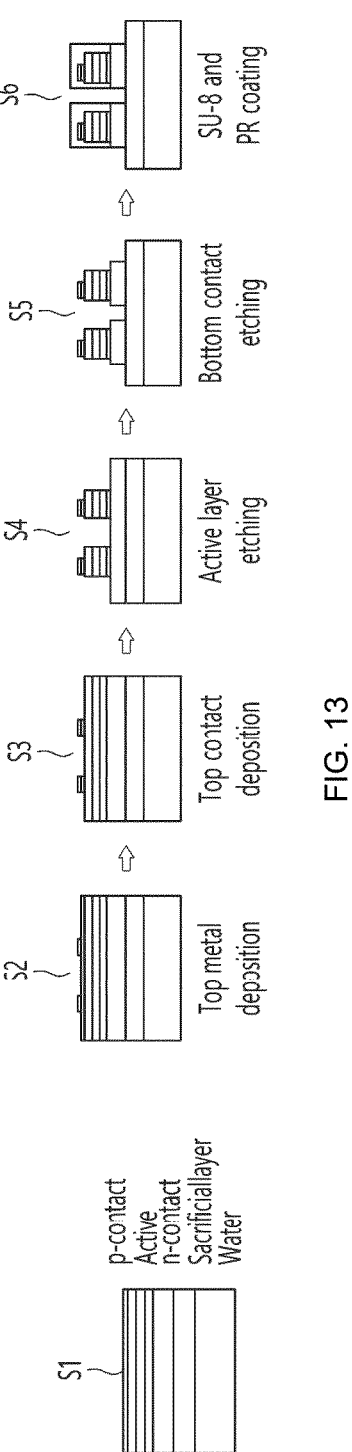
Figure 14:
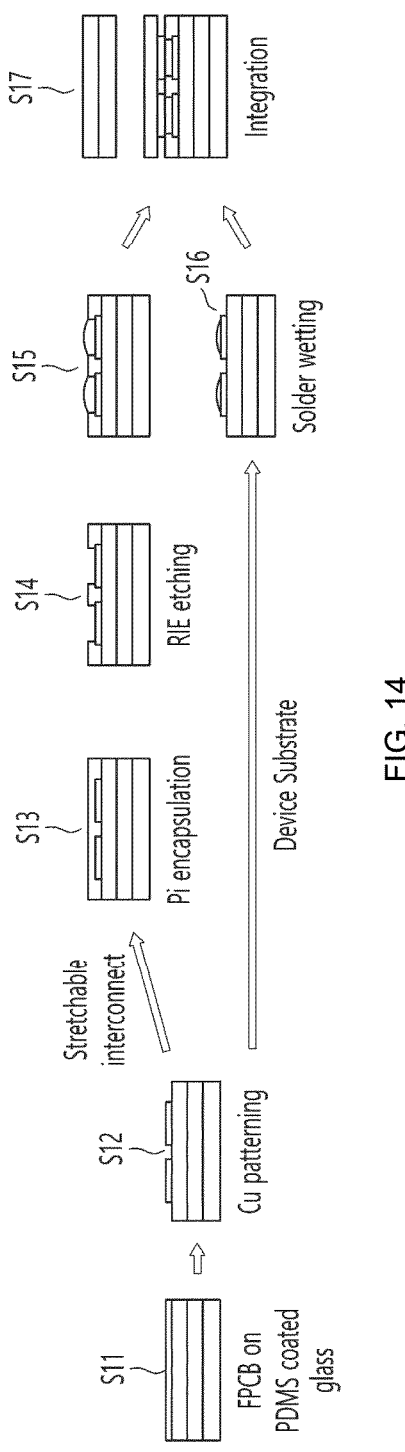
Figure 15:
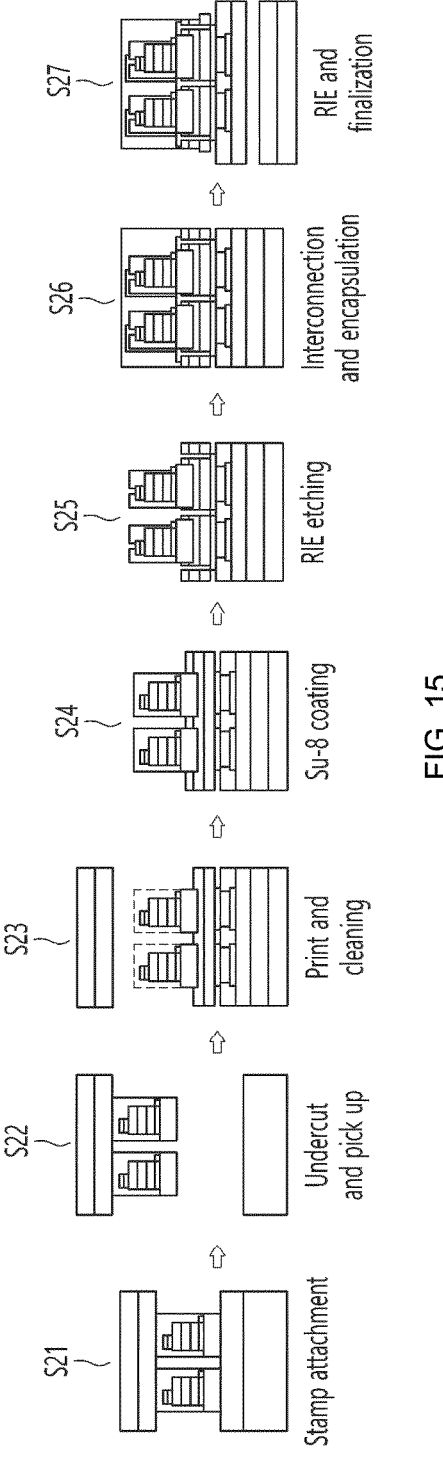

FIGS. 13 to 15 are views illustrating a method of manufacturing a stretchable electronic device according to an embodiment, FIG. 13 is a method of manufacturing a device, FIG. 14 is a method of manufacturing a circuit layer and an interconnection layer, and FIG. 15 is a view illustrating a final assembly process.

Referring to FIG. 13, each layer constituting a device may be stacked on a wafer (S1), and an electrode layer may be stacked (S2). A sacrificial layer may be provided on a rectangular upper side of the wafer. Each layer may provide a micro LED formed of AlGaInP. Thereafter, a top contact layer (S3), an active layer (S4), and a bottom contact layer (S5) may be removed by using an etching process. Finally, each device may be protected using a transparent protection layer (S6).

The device may include devices simultaneously manufactured, on a single wafer, in the same number as the number of devices to be transferred to one island, the number of devices to be transferred to a single array 2, or the number of devices to be transferred to at least two islands. Accordingly, the number of transfer processes may be reduced and the manufacturing process may be simplified.

Referring to FIG. 14, a substrate may be provided on glass and a sacrificial layer (S11). The sacrificial layer may be a PDMS, and the substrate may be an FPCB. Thereafter, the substrate may be patterned (S12). The metal layer on the substrate may be patterned to provide a first conductive layer 12 and a second conductive layer 22, respectively. The patterning aspect of the metal layer may be related to each other for the first and second conductive layers 12 and 22 but may not be the same.

An insulating layer is coated on the substrate pattered in the aspect of the first conductive layer 12 (S13). Thereafter, the resultant structure is etched to expose the spacing part of the first conductive layer 12 may be exposed (S14). In this case, the insulating layer may provide the second insulating layer 13. A soldering process may be performed with respect to the exposed first conductive layer 12 to provide the bonding layer (S15). In this case, the bonding layer may provide the first bonding layer 14.

A soldering process may be performed with respect to the substrate pattered in the aspect of the second conductive layer 22 to provide a bonding layer on the second conductive layer 22 (S16). In this case, the bonding layer may provide the second bonding layer 23.

The two substrates may be bonded such that the two bonding layers are coupled (S17). The interconnecting layer 10 and the circuit layer 20 may be coupled to each other through the process. The glass and the sacrificial layer on the circuit layer 20 may be removed to expose the second conductive layer 22.

Referring to FIG. 15, a stamp is attached to a plurality of devices on a wafer (S21). As the stamp, an adhesive material such as PDMS may be used. Thereafter, the sacrificial layer may be separated, a plurality of devices may be separated in a single process (S22), and a printing process may be performed on a top surface of the circuit layer 20 (S23).

After cleaning, the protective layer may be coated (S24) and etched to machine the via hole 35 such that the electrode 32 is provided (S25). The via holes may be provided in both the insulating layer and the protective layer.

A material forming an electrode may be inserted into the via hole 35 to made an electrical connection between the second conductive layer 22 and the device 31, and the protective layer may be provided (S26). Finally, an unnecessary protective layer may be removed through an etching process, and the glass and the sacrificial layer of the interconnecting layer 10 may be removed (S27).

What is claimed is:

1. A stretchable electronic device comprising:
an array including a plurality of islands spaced apart from each other and an interconnector to perform a stretchable action between the plurality of islands, one of the plurality of islands including a plurality of devices; and
an external connection to apply an electrical signal to the array,
wherein a configuration of the array includes:
an interconnecting layer including the interconnector and configured to supply the applied electrical signal from the external connection to the plurality of islands through the interconnector;
a circuit layer on the interconnecting layer; and
a device layer disposed on the circuit layer and including the plurality of devices, wherein the interconnecting layer includes;
a first insulating layer positioned at a lower portion of the Interconnecting layer;
a first conductive layer on the first insulating layer; and
a second insulating layer on the first conductive layer;
wherein the circuit layer includes:
a second bonding layer on and electrically connected to the interconnecting layer;
a second conductive layer on the second bonding layer; and
a third insulating layer on the second conductive layer, and
wherein an empty space is provided between a bottom surface of the second conductive layer and an upper surface of the second insulating layer.

2. The stretchable electronic device of claim 1, wherein the interconnector has no circuit layer and device layer.

3. The stretchable electronic device of claim 1, wherein
the second insulating layer includes a plurality of openings exposing the first conductive layer; and
the interconnecting layer further includes a first bonding layer in the plurality of openings and electrically connecting the exposed first conductive layer to the second bonding layer.

4. The stretchable electronic device of claim 3, wherein the first bonding layer is in three or four of the plurality of openings in the one of the plurality of islands.

5. The stretchable electronic device of claim 1, wherein the plurality of devices are on the third insulating layer and the device layer further includes:
for each device of the plurality of devices, first and second electrodes each electrically connecting the device to the second conductive layer to input or output an electrical signal; and
a protective layer on and to protect the plurality of devices and the first and second electrodes.

6. The stretchable electronic device of claim 1,
wherein the plurality of devices include a first device and a second device which have different types, and
wherein all of the first device and the second device are mounted on the one of the plurality of islands.

7. The stretchable electronic device of claim 6,
wherein the first device includes a number of first devices, the second device includes a number of second devices, and the number of first devices is greater than the number of second devices, and
wherein the second devices are configured to control the first devices.

8. The stretchable electronic device of claim 1, wherein a number of the plurality of devices is n^2, where n is natural number greater than 1.

9. A stretchable electronic device comprising:
an array including a plurality of islands spaced apart from each other and an interconnector to perform a stretchable action between the plurality of islands, one of the plurality of islands including a device; and
an external connection to apply an electrical signal to the arrays,
wherein a configuration of the array includes:
an interconnecting layer including the interconnector and configured to supply the applied electrical signal from the external connection; to the plurality of islands through the interconnector;
a circuit layer on the interconnecting layer; and
a device layer on the circuit layer and including the device,
wherein the interconnector includes:

a first interconnector extending in a left-right direction; and a second interconnector extending in an up-down direction, and wherein three independent conductive lines are provided 5 through the first and second interconnectors.

* * * * *